United States Patent
Chang et al.

(10) Patent No.: US 6,855,602 B2
(45) Date of Patent: Feb. 15, 2005

(54) METHOD FOR FORMING A BOX SHAPED POLYGATE

(75) Inventors: Yi-Shing Chang, Hsin Chu (TW);
Yeur-Luen Tu, Taichung (TW);
Chia-Shiung Tsai, Hsin-Chu (TW);
Wen-Ting Chu, Kaohsing County (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 19 days.

(21) Appl. No.: 10/401,941

(22) Filed: Mar. 27, 2003

(65) Prior Publication Data

US 2004/0188749 A1 Sep. 30, 2004

(51) Int. Cl.[7] .............................................. H01L 29/62
(52) U.S. Cl. ....................... 438/264; 438/288; 438/297; 438/692; 438/694; 438/696; 438/791; 257/314; 257/347

(58) Field of Search ................................. 438/264, 288, 438/297, 692, 694, 696, 791; 257/314, 347

(56) References Cited

U.S. PATENT DOCUMENTS

2003/0129840 A1 * 7/2003 Kumar et al. ................ 438/694
2004/0036118 A1 * 2/2004 Abadeer et al. ............. 257/347

* cited by examiner

Primary Examiner—Edward Wojciechowicz
(74) Attorney, Agent, or Firm—Tung & Associates

(57) ABSTRACT

A method for forming an improved etching hardmask oxide layer in a polysilicon etching process including providing a planarized semiconductor wafer process surface including adjacent first exposed polysilicon portions and exposed oxide portions; selectively etching through a thickness portion of the exposed oxide portions; thermally growing an oxide hardmask layer over the exposed polysilicon portions to form oxide hardmask portions; exposing second exposed polysilicon portions adjacent at least one oxide hardmask portion; and, etching through a thickness portion of the second exposed polysilicon portions.

20 Claims, 3 Drawing Sheets

METHOD FOR FORMING A BOX SHAPED POLYGATE

FIELD OF THE INVENTION

This invention generally relates to processing method for forming semiconductor device structures, and more particularly to a method for forming more uniform oxide layers over polysilicon substrates, for example in box-shaped polysilicon gates an important feature in forming memory devices such as flash memory devices with box shaped poly gate structures.

BACKGROUND OF THE INVENTION

Oxide layer uniformity is important in several applications in forming semiconductor devices. The uniformity of oxide layers can be affected by a number of processing variables. Processes such as the rate and uniformity of thermal oxide growth may be affected by the nature of the underlying layer and adjacent layers. Other processes including chemical mechanical polishing may undesirably cause variations in topography of a planarized surface due to preferential polishing of different materials making up portions of a semiconductor device polishing surface. As a result of oxide layer thickness nonuniformity, for example, where the oxide layer is used as an etching hardmask, subsequent processes such as etching may result in undesirable etching of selected portions of the semiconductor device leading to degraded performance of the completed semiconductor device.

For example, one group of semiconductor devices where the thickness uniformity of oxide layers is extremely important are flash memory devices. For example, in flash EEPROM (Electrically Erasable Programmable Read Only Memories), for example including polysilicon source and word lines, the level of the voltage required to be applied to word or source lines, (e.g., Vss) applied to a source line to accomplish erase operations, is critical and is affected by oxide layer thickness and uniformity. For example, small changes in the contact resistant (e.g., Rss) at an electrical contact portion of the polysilicon gate of a source or word line may adversely affect both write and erase operations including altering hot electron injection processes or Fowler-Nordheim tunneling processes at the gate electrode, both processes essential to the reliable operation of the flash memory devices. For example the electric field strength within a polysilicon gate in combination with the properties of the gate oxide, also referred to as a tunnel oxide, determine the desired flow of current in response to applied voltages to accomplish write and erase operations.

For example in the formation of polysilicon word and source lines in the formation of EEPROM memory cells, for example employing a self-aligned word line, an oxide hardmask is thermally grown over exposed polysilicon portions prior to an etching process to form the polysilicon structures. Some problems with prior art processing approaches have emerged including a lack in uniformity of the oxide hardmask. As a result, in subsequent etching processes, the hardmask is penetrated prematurely and undesirable etching of underlying polysilicon structures takes place degrading electrical performance of the memory device. Approaches to solve the problem including forming a thicker oxide layer hardmask to prevent premature etching breakthrough have had the undesired effect of increasing an electrical contact resistance to the polysilicon structure thereby also degrading electrical performance of the memory device. In addition, other processing approaches have been found or are believed to contribute to unacceptable behavior of the oxide hard mask layer, requiring novel processing approaches to achieve acceptable memory device behavior.

There is therefore a need in the flash memory device processing art to develop novel processing methods to improve the yield and reliability of flash memory devices including forming an oxide hardmask with optimal etching resistance and electrical contact resistance.

It is therefore an object of the invention to provide novel processing methods to improve the yield and reliability of flash memory devices including forming an oxide hardmask with optimal etching resistance and electrical contact resistance, while overcoming other deficiencies and shortcomings of the prior art.

SUMMARY OF THE INVENTION

To achieve the foregoing and other objects, and in accordance with the purposes of the present invention as embodied and broadly described herein, the present invention provides a method for forming an improved etching hardmask oxide layer in a polysilicon etching process.

In a first embodiment, the method includes providing a planarized semiconductor wafer process surface including adjacent first exposed polysilicon portions and exposed oxide portions; selectively etching through a thickness portion of the exposed oxide portions; thermally growing an oxide hardmask layer over the exposed polysilicon portions to form oxide hardmask portions; exposing second exposed polysilicon portions adjacent at least one oxide hardmask portion; and, etching through a thickness portion of the second exposed polysilicon portions.

In a second embodiment, a method for forming an improved self-aligned box-shaped polysilicon word lines in an EEPROM memory device is provided including providing a semiconductor wafer comprising a process surface having at least one field effect transistor (FET) device comprising a source line portion including a polysilicon gate electrode and adjacent oxide sidewall spacers; blanket depositing an in-situ doped amorphous polysilicon layer over the process surface; blanket depositing a silicon nitride layer over the in-situ doped amorphous polysilicon layer according to a PECVD process to avoid crystallization of the in-situ doped amorphous polysilicon layer; carrying out a CMP process to expose the polysilicon gate, the oxide sidewall spacers, and a first portion of the in-situ doped amorphous polysilicon layer to respectively form exposed oxide portions and exposed polysilicon portions; etching through a thickness portion of the exposed oxide portions; and, thermally growing a hardmask oxide layer over the exposed polysilicon portions.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to an exemplary embodiment including the formation of a box-shaped self aligned word line in a split gate configuration of an EEPROM (flash memory) device, it will be appreciated that the method of the present invention may be advantageously used in the formation of any microstructure including micro-integrated circuit manufacture where a planarized layer including adjacent polysilicon and oxide areas are advantageously treated according to embodiments of the invention to produce a more uniform oxide hardmask layer for use in a subsequent etching process.

For example referring to FIGS. 1A to 1G, are shown cross sectional schematic views of an exemplary portion of a memory cell including box shaped self aligned word lines for use in a flash memory device at stages in manufacture. For example, details of the manufacturing steps in forming portions of the device, for example, the source polysilicon gate (source line) and floating gate structures are detailed in co-assigned U.S. Pat. No. 6,482,700 which is hereby incorporated by reference in its entirety.

Figure 1A:
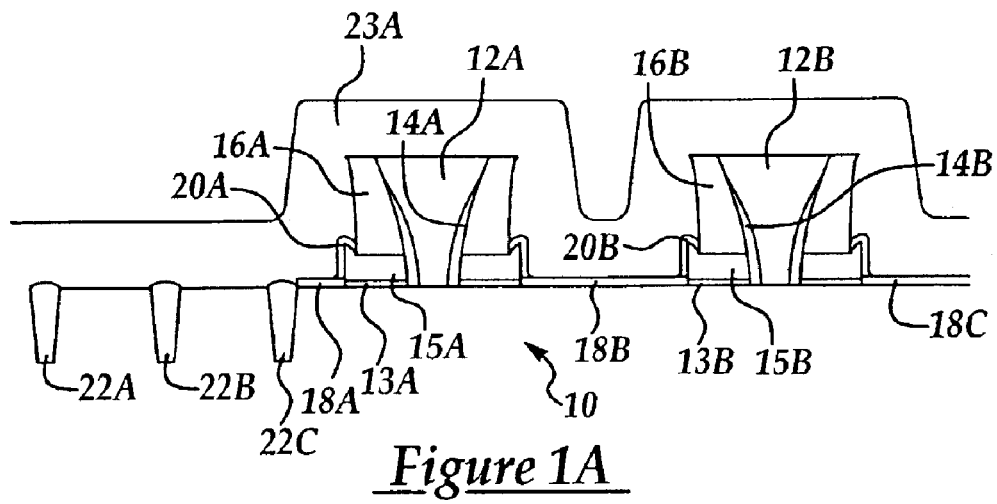
FIGS. 1A–1G are cross sectional schematic views of a portion of a flash memory device at stages in manufacture according to an embodiment of the present invention.

Shown in FIG. 1A are source polysilicon gate structures 12A and 12B forming a portion of a source line over doped silicon substrate (e.g., wafer) 10 including doped source regions (not shown) formed in the silicon substrate 10 underlying the source polysilicon gate electrodes 12A and 12B. Adjacent first dielectric sidewall spacers e.g., 14A, 14B, for example silicon nitride (e.g., SiN) are provided along the sidewalls of the polysilicon gates 12A and 12B. Floating gate polysilicon electrodes e.g. 15A and 15B are provided adjacent either side of the source polysilicon gate electrodes 12A and 12B respectively overlying a first gate oxide layer e.g., 13A, 13B and isolated from the source polysilicon gate electrodes by the first dielectric sidewall spacers e.g., 14A and 14B. Formed overlying the floating gate polysilicon electrodes e.g. 15A and 15B, are second dielectric sidewall spacers e.g., 16A and 16B, for example silicon oxide based, for example, formed of TEOS oxide. Also provided is a tunnel oxide layer, also referred to as a gate oxide layer, e.g., 18A, 18B, 18C, formed over exposed portions of the silicon substrate 10, for example by a conventional oxide process to form a silicon oxide (e.g., $SiO_2$) layer, preferably from about 100 Angstroms to about 200 Angstroms, more preferably about 150 Angstroms in thickness. In addition, a dielectric layer, for example silicon oxide, also referred to as an inter-poly dielectric e.g., 20A, 20B, is formed, for example by oxide deposition to cover the exposed sidewalls of the floating gate polysilicon electrodes e.g. 15A and 15B, preferably formed having a thickness of about 100 Angstroms to about 200 Angstroms. In addition, isolation trenches e.g., 22A, 22B, 22C are provided adjacent a portion memory cell region, for example the memory cell forming a split gate filed effect transistor (FET) configuration.

Still referring to FIG. 1A, an in-situ doped polysilicon layer 23A formed by conventional means is blanket deposited to cover the process surface. In a preferred embodiment, the in-situ doped polysilicon layer is deposited as in-situ doped amorphous polysilicon. For example, the charge carrier generating N or P doping is added in-situ in a CVD amorphous silicon deposition process carried out at temperatures of less than about 580° C. to avoid crystallization, for example adding dopant gas, such as diborane ($B_2H_6$), phosphine ($PH_3$) or arsine ($AsH_3$) during the deposition process. In another embodiment according to the present invention, the amorphous polysilicon layer 23A is formed having one of an N or P doping concentration of greater than about $1\times10^{20}$ dopant atoms/cm$^3$. The formation of polysilicon in the amorphous form as well as the doping level are important factors in producing a subsequent oxide hardmask having uniform thickness. For example, it has been found the higher level of doping advantageously accelerates oxide growth thereby reducing a thermal processing time and minimizing crystallization of the amorphous polysilicon layer 23A in a subsequent thermal oxide growth process. For example, it has been found that crystallization and grain growth of the amorphous polysilicon layer causes unacceptable thickness uniformity in a subsequently formed oxide hardmask layer due to the presence of grain boundary. Consequently, by reducing crystallization and grain growth, an optimal hardmask oxide thickness with improved thickness uniformity is produced providing improved etching protection of the polysilicon gate portions during a subsequent plasma etching process of the polysilicon layer 20A to form self-aligned box shaped word line polysilicon gates as shown below. For example, the in-situ doped amorphous polysilicon layer 23A is formed to a thickness of about 1000 Angstroms to about 3000 Angstroms.

Figure 1B:
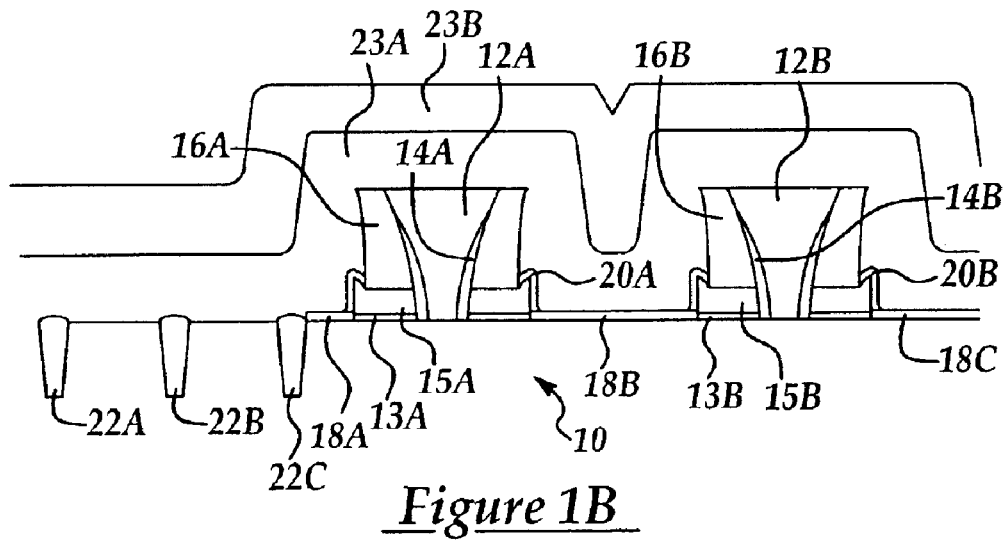

Referring to FIG. 1B, in another embodiment of the method according to the present invention, a silicon nitride layer 23B (e.g., SiN) is blanket deposited over the amorphous polysilicon layer 23A by a PECVD (plasma enhanced chemical vapor deposition) process, the details of such methods known in the art. A relatively thick layer of silicon nitride, for example from about 1000 to about 4000 Angstroms is deposited to protect the polysilicon layer 23A from oxidation in subsequent processing steps. For example, it has been found according to one aspect of the present invention that using a PECVD process carried out at temperatures from about 200° C. to about 400° C. to deposit the silicon nitride layer 20B, advantageously avoids crystallization grain growth of the in-situ doped amorphous polysilicon layer 23A, in contrast to processes such as LPCVD carried out at temperatures from about 700° C. to about 800° C.

For the reasons previously mentioned, grain growth and crystallization of the amorphous polysilicon layer 23A leads to subsequent thickness non-uniformity in an oxide hard mask formed over the polysilicon gate portions. For example, formation of a non-uniformly thick oxide hardmask layer over polysilicon portions results in premature etching breakthrough at thinner portions of the oxide hardmask in a subsequent etching process to form self-aligned polysilicon word line gates. According to one aspect of the present invention, using a low temperature silicon nitride PECVD process to deposit the silicon nitride layer 23B reduces the crystallization and grain growth of the amorphous polysilicon layer 23A improving thickness uniformity in the subsequently formed oxide hardmask layer. The more uniformly thick oxide hardmask layer avoids premature RIE etching breakthrough of the oxide hard mask layer during the word line polysilicon gate electrode formation process and thereby advantageously avoids the formation of etching pits and trenches in the polysilicon word and source line gate electrodes, especially at a polysilicon/oxide interface.

Figure 1C:
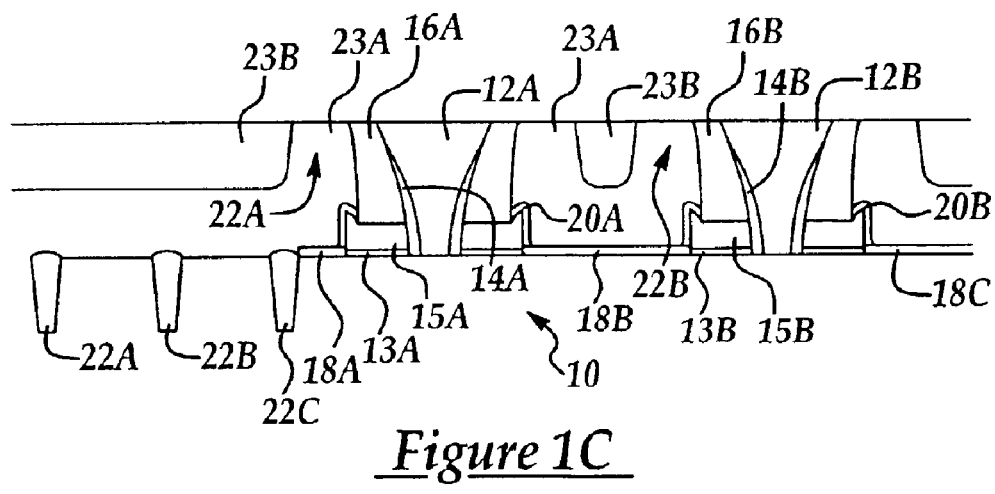

Referring to FIG. 1C, following deposition of the silicon nitride layer 23B, optionally a photolithographic patterning and etching process is carried out to remove a portion of the silicon nitride layer 23B prior to a CMP process. A CMP process is then carried out to planarize and remove remaining portions of the silicon nitride layer 23B and the polysilicon layer 23A to reveal the uppermost portion of the source line polysilicon gate electrodes e.g., 12A and 12B and partially defining an upper portion e.g., 22A and 22B of polysilicon word line gate electrodes for subsequent formation of self-aligned box-shaped polysilicon word line gate electrodes.

Figure 1D:
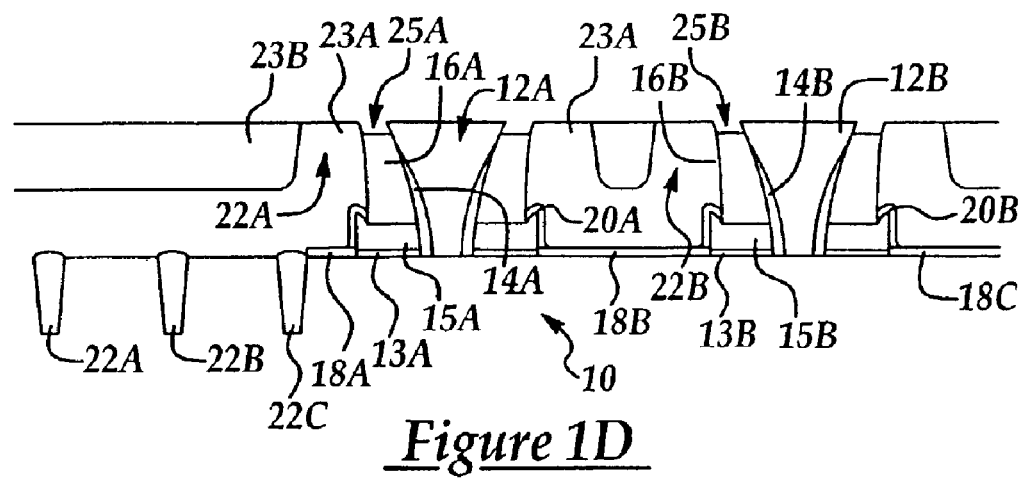

Referring to FIG. 1D, according to another embodiment of the present invention, following the CMP planarization process, an oxide etching process is carried out to etchback through a thickness portion, e.g., 25A and 25B of the exposed second sidewall spacers e.g., 16A and 16B. Preferably, the exposed second sidewall spacers are etched back (through a thickness portion) according to an oxide etching process to a depth of about 100 Angstroms to about 300 Angstroms below adjacent polysilicon surface levels formed by the CMP process. The oxide etching process is carried out by one of a dry or wet oxide etching process. For example, conventional wet and dry etching processes suitably used include dipping in a solution of dilute hydrofluoric acid, and hydrofluorocarbon containing RIE.

For example, it has been found that following the CMP process that exposed oxide portions of the planarized surface, such as second sidewall oxide spacers e.g., 16A and 16B, have a slightly lower polishing rate resulting in exposed oxide portions being at a slightly higher level compared to adjacent polysilicon portions, for example polysilicon word line gate electrode portions 22A and polysilicon source line gate electrode portion 12A. It has been found that in a subsequent thermal oxide growth process to form a hardmask oxide layer over the exposed polysilicon portions, a non-uniform hardmask oxide layer thickness is produced, the hardmask oxide layer being thinner at the oxide interface edges of the exposed polysilicon portions. Consequently, in a subsequent word line formation process by RIE, premature etching breakthrough occurs at the thinner oxide hardmask portions, for example at a polysilicon/oxide interface causing undesired etching of the polysilicon portions.

Figure 1E:
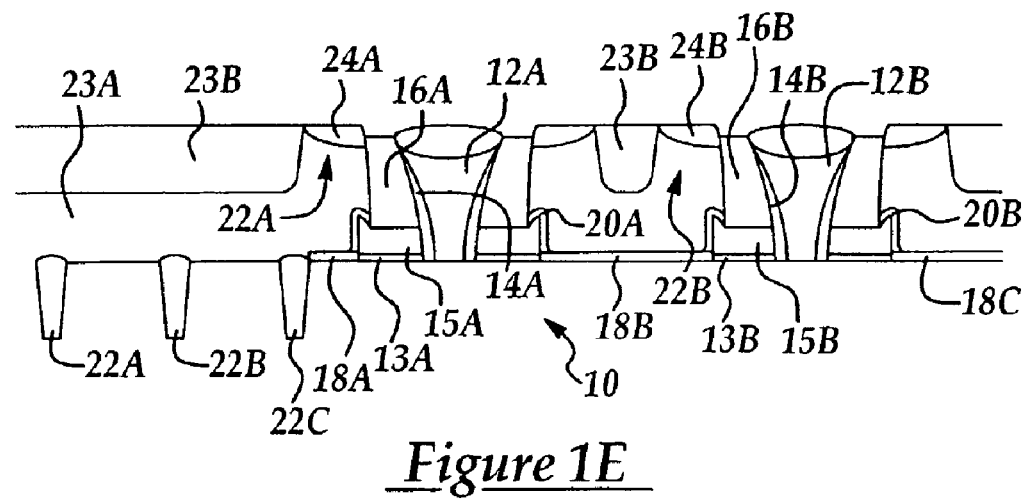

Referring to FIG. 1E, following the oxide etchback process, according to an aspect of the invention, an oxide layer is thermally grown by conventional processes, for example, using one of a furnace or rapid thermal oxidation (RTO) process at temperatures of about 800° to about 1100° C. to form a hardmask oxide layer e.g., 24A, 24B, over the exposed polysilicon portions, for example polysilicon word line gate electrode portions 22A and 22B and polysilicon source line gate electrodes 12A and 12B. Advantageously, according to embodiments of the present invention, an improved hardmask oxide layer thickness is formed, increasing an oxide layer thickness at the polysilicon edge portions at the oxide/polysilicon interface. As will be appreciated by one skilled in the art, the thermally grown oxide grows into the exposed polysilicon. Advantageously, as a consequence of the previous oxide etchback process shown in FIG. 1D, the hardmask oxide thickness e.g., 24A, 24B is grown more uniformly across the exposed polysilicon portions, avoiding thinning of the oxide hardmask at the edge portions of the polysilicon features, including polysilicon gate electrode word line and source line portions.

Figure 1F:
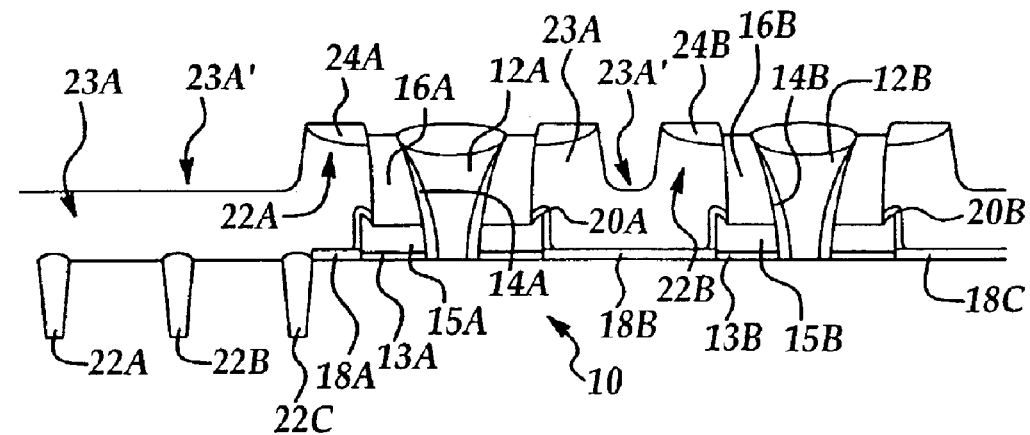

Referring to FIG. 1F, following the formation of the hardmask oxide layer e.g., 24A, 24B, a conventional silicon nitride wet etching process, for example using a hot solution of phosphoric acid ($H_3PO_4$), is carried out to remove remaining portions of the PECVD silicon nitride layer 23B, exposing second portions of the amorphous polysilicon layer 23A e.g., 23A'.

Figure 1G:
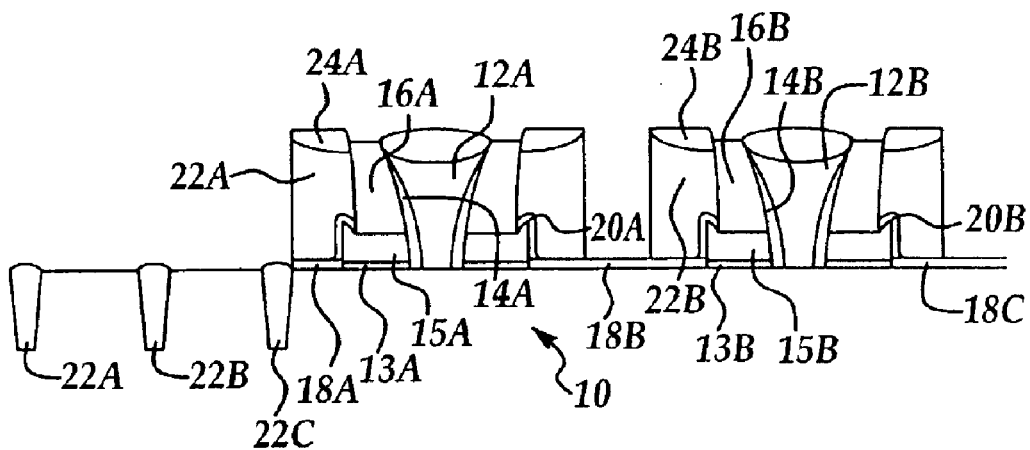

Referring to FIG. 1G, following the silicon nitride wet etching process, a conventional polysilicon RIE etching process is carried out to remove the exposed portions of the amorphous polysilicon layer 23A, using the hardmask layer e.g., 24 as an etching mask to completed the formation self-aligned box shaped word line polysilicon gate electrodes e.g., 22A and 22B self aligned to tunnel oxide portions e.g., 18A and adjacent isolation trench e.g., 22A.

Advantageously, according to the present invention, the improved oxide hardmask layer formed according to embodiments of the present invention acts to provide a uniform thickness of about 150 Angstroms to about 250 Angstroms, more preferably about 200 Angstroms, thereby providing sufficient protection in the polysilicon RIE etching process to avoid premature breakthrough. In addition, the improved oxide hardmask layer formed according to embodiments of the present invention avoids the necessity of forming a thicker hardmask oxide layer to avoid premature etching breakthrough which has the undesirable effect of increasing the resistivity, e.g., Rss of polysilicon word line and source line portions and thereby degrading the electrical performance e.g., Vss, of the EEPROM flash memory device. Moreover, the improved oxide hardmask layer formed according to embodiments of the present invention is advantageously formed in part believed to be due to the lower processing temperatures of the silicon nitride PECVD deposition process, the shorter processing times required for thermal oxide growth to a desired thickness over the word lines due to the enhanced doping level in the amorphous polysilicon layer, while allowing an optimal hardmask oxide layer thickness to be produced over the source lines to avoid an undesired increase in electrical contact resistance.

Figure 2:
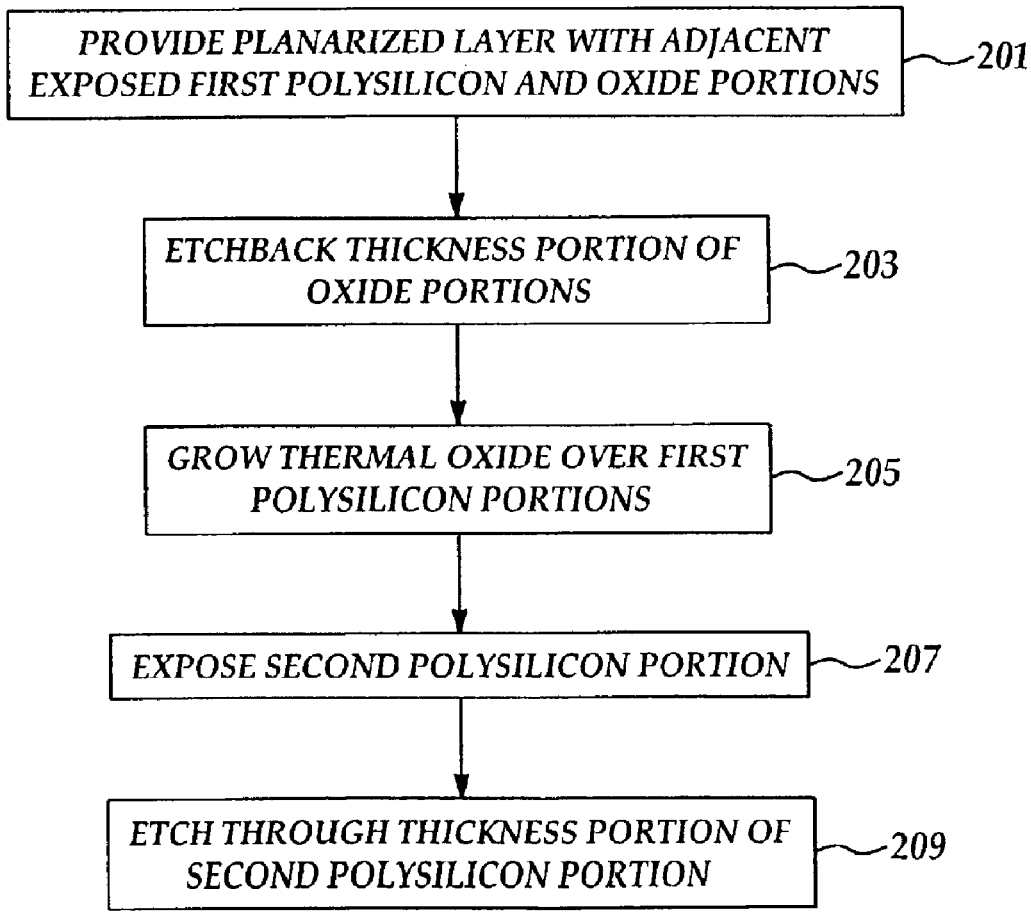
FIG. 2 is a process flow diagram including several embodiments of the present invention.

Referring to FIG. 2 is a process follow diagram including several embodiments of the present invention. In process 201, a planarized layer including adjacent first exposed polysilicon portions and oxide portions is provided. In process 203, an oxide etchback process is carried out to etchback a portion of the portions to a lower level compared to the adjacent polysilicon portions. In process 205, a thermal oxide growing process is carried out to grow an oxide hardmask layer over the exposed polysilicon portions. In process 207, second exposed polysilicon portions are formed adjacent the oxide hardmask layer covered polysilicon portions. In process 209, an RIE etching is carried out to etch through a thickness portion of the second exposed polysilicon portions, for example to form a self-aligned box shaped polysilicon word line gate.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. A method for forming an improved etching hardmask oxide layer in a polysilicon etching process comprising the steps of:

providing a planarized semiconductor wafer process surface comprising adjacent first exposed polysilicon portions and exposed oxide portions;

selectively etching through a thickness portion of the exposed oxide portions;

thermally growing an oxide hardmask layer over the exposed polysilicon portions to form oxide hardmask portions;

exposing second exposed polysilicon portions adjacent at least one oxide hardmask portion; and, etching through a thickness portion of the second exposed polysilicon portions.

2. The method of claim 1, wherein at least one of the first exposed polysilicon portions comprises amorphous polysilicon.

3. The method of claim 2, wherein the at least one of the first exposed polysilicon portions comprises one of N or P doping at a level greater than about $1 \times 10^{20}$ dopant atoms/$cm^3$.

4. The method of claim 3, wherein the at least one of the first exposed polysilicon portions is formed by an in-situ doping CVD method.

5. The method of claim 1, wherein the step of providing a planarized semiconductor wafer process surface comprises a chemical mechanical polish (CMP) process.

6. The method of claim 5, wherein the CMP process comprises removing a portion of an uppermost silicon nitride layer and a portion of an underlying in-situ doped amorphous polysilicon layer.

7. The method of claim 6, wherein the silicon nitride layer is formed over the in-situ doped amorphous polysilicon layer by a PECVD process at a temperature less than about 500° C.

8. The method of claim 1, wherein the exposed oxide portions comprise TEOS silicon oxide.

9. The method of claim 1, wherein the step of thermally growing an oxide hardmask layer comprises one of a furnace oxide growing process or a rapid thermal oxidation (RTO) process.

10. The method of claim 1, wherein the step of exposing second exposed polysilicon portions comprises a wet etching process to remove a portion of a PECVD deposited silicon nitride layer.

11. The method of claim 1, wherein the step of etching through a thickness portion comprises a polysilicon dry etching process.

12. The method of claim 1, wherein the step of selectively etching through a thickness portion comprises removing from about 100 Angstroms to about 300 Angstroms.

13. The method of claim 1, wherein the oxide hardmask layer is formed having a thickness of from about 100 Angstroms to about 300 Angstroms.

14. The method of claim 1, where the step of etching through a thickness portion forms a self-aligned box-shaped polysilicon gate as a portion of a word line in an EEPROM memory device.

15. A method for forming an improved self-aligned box-shaped polysilicon word line in an EEPROM memory device comprising the steps of:

provndmg a semiconductor wafer comprising a process surface having at least one field effect transistor (FET) device comprising a source line portion including a polysilicon gate electrode and adjacent oxide sidewall spacers;

blanket depositing an in-situ doped amorphous polysilicon layer over the process surface;

blanket depositing a silicon nitride layer over the in-situ doped amorphous polysilicon layer according to a PECVD process to avoid crystallization of the in-situ doped amorphous polysilicon layer;

carrying out a CMP process to expose the polysilicon gate, the oxide sidewall spacers, and a first portion of the in-situ doped amorphous polysilicon layer to respectively form exposed oxide portions and exposed polysilicon portions;

etching through a thickness portion of the exposed oxide portions; and, thermally growing a hardmask oxide layer over the exposed polysilicon portions.

16. The method of claim 14, further comprising carrying out a wet etching process to expose a second portion of the in-situ doped amorphous polysilicon layer underlying a portion of the silicon nitride layer.

17. The method of claim 15, further comprising carrying out a dry etching process to etch through a thickness portion of second portion to form a self aligned box-shaped polysilicon word line portion of an EEPROM FET device.

18. The method of claim 14, wherein the step of etching through a thickness portion comprises etching through a thickness of about 100 Angstroms to about 300 Angstroms.

19. The method of claim 14, wherein the oxide hardmask layer is formed having a thickness of from about 100 Angstroms to about 300 Angstroms.

20. The method of claim 14, wherein the in-situ doped amorphous polysilicon layer is formed having one of P and N type doping at a doping concentration of greater than about $1 \times 10^{20}$ dopant atoms/cm$^3$.

* * * * *